(12) United States Patent
Aichinger et al.

(10) Patent No.: US 11,295,951 B2
(45) Date of Patent: Apr. 5, 2022

(54) WIDE BAND GAP SEMICONDUCTOR DEVICE AND METHOD FOR FORMING A WIDE BAND GAP SEMICONDUCTOR DEVICE

(71) Applicant: Infineon Technologies AG, Neubiberg (DE)

(72) Inventors: Thomas Aichinger, Faak am See (AT); Gerald Rescher, Bruckl (AT); Michael Stadtmueller, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/374,457

(22) Filed: Apr. 3, 2019

(65) Prior Publication Data

US 2019/0311903 A1     Oct. 10, 2019

(30) Foreign Application Priority Data

Apr. 4, 2018   (DE) .......................... 102018107966.4

(51) Int. Cl.
*H01L 29/40*   (2006.01)
*H01L 21/02*   (2006.01)
(Continued)

(52) U.S. Cl.
CPC ...... *H01L 21/049* (2013.01); *H01L 21/02164* (2013.01); *H01L 21/02271* (2013.01);
(Continued)

(58) Field of Classification Search
CPC ............. H01L 21/049; H01L 21/02271; H01L 21/02337; H01L 29/1033; H01L 29/1608; H01L 29/401; H01L 29/78
See application file for complete search history.

(56) References Cited

U.S. PATENT DOCUMENTS 5,817,549 A    10/1998  Yamazaki et al.
2005/0017272 A1  1/2005  Yamashita et al.
(Continued)

FOREIGN PATENT DOCUMENTS

DE    4333155 A1   3/1995
EP    1323185 A2   7/2003
(Continued)

OTHER PUBLICATIONS

Olafsson "Detection and Removal of Traps at the SiO2/SiC Interface" pp. 1-74 Thesis for the Degree of Doctor of Philosophy, Chalmers University of Technology, Goteborg, Sweden (2004) (Year: 2004).*

(Continued)

*Primary Examiner* — Fernando L Toledo
*Assistant Examiner* — Valerie N Newton
(74) *Attorney, Agent, or Firm* — Murphy, Bilak & Homiller, PLLC

(57) ABSTRACT

A method for forming a wide band gap semiconductor device is provided. The method includes forming a gate insulation layer on a wide band gap semiconductor substrate and annealing the gate insulation layer using at least a first reactive gas species and a second reactive gas species, wherein the first reactive gas species differs from the second reactive gas species. The method can include forming a gate electrode on the gate insulation layer after annealing the gate insulation layer.

13 Claims, 3 Drawing Sheets

(51) Int. Cl.
    *H01L 21/04*     (2006.01)
    *H01L 29/16*     (2006.01)
    *H01L 29/78*     (2006.01)
    *H01L 29/66*     (2006.01)
    *H01L 29/10*     (2006.01)

(52) U.S. Cl.
    CPC .... *H01L 21/02337* (2013.01); *H01L 29/1033* (2013.01); *H01L 29/1608* (2013.01); *H01L 29/401* (2013.01); *H01L 29/66068* (2013.01); *H01L 29/78* (2013.01)

(56) References Cited

U.S. PATENT DOCUMENTS

| | | | |
|---|---|---|---|
| 2015/0214047 A1* | 7/2015 | Hama | H01L 21/0228 438/285 |
| 2018/0308937 A1* | 10/2018 | Hirose | H01L 29/518 |

FOREIGN PATENT DOCUMENTS

| | | |
|---|---|---|
| EP | 1378006 B1 | 9/2008 |
| JP | 2008182070 A | 8/2008 |
| JP | 2010109276 A | 5/2010 |
| JP | 2011165941 A | 8/2011 |
| JP | 2014045053 A | 3/2014 |
| JP | 2015142034 A | 8/2015 |
| JP | 2016157762 A | 9/2016 |
| JP | 2017216306 A | 12/2017 |
| WO | 2015005397 A1 | 1/2015 |

OTHER PUBLICATIONS

Lai et al. "Effects of Nitridation and Annealing on Interface Properties of Thermally Oxidized Si02/SiC Metal-Oxide-Semiconductor System" Applied Physics Letters 76(25): 3744-3746 (2000) (Year: 2000).*

Chung et al. "Improved Inversion Channel Mobility for 4H—SiC MOSFETs Following High Temperature Anneals in Nitric Oxide" IEEE Electron Device Letters Accepted for Publication (2001) (Year: 2001).*

Chung et al. "Effect of Nitric Oxide Annealing on the Interface Trap Densities Near the Band Edges in the 4H Polytype of Silicon Carbide" Applied Physics Letters 76(13): 1713-1715 (2000) (Year: 2000).*

WO2015005397 Silicon Carbide Semiconductor (English Translation) (Year: 2015).*

SZE, "Physics of Semiconductor Devices", 2nd Edition, John Wiley & Sons, 1981, p. 852.

Sridevan, S., et al., "Lateral N-Channel Inversion Mode 4H—SiC MOSFET's", IEEE Electron Device Letters, vol. 19, No. 7, Jul. 1998, pp. 228-230.

* cited by examiner

WIDE BAND GAP SEMICONDUCTOR DEVICE AND METHOD FOR FORMING A WIDE BAND GAP SEMICONDUCTOR DEVICE

TECHNICAL FIELD

Examples relate to methods for forming a wide band gap semiconductor device and to wide band gap semiconductor devices.

BACKGROUND

In wide band gap semiconductor devices, e.g. SiC (SiC: silicon carbide) MOSFETs (metal oxide semiconductor field effect transistors), an inversion channel mobility may be low and a threshold voltage instability or bias temperature instability (BTI) may be high compared to other semiconductor devices like silicon (Si) MOSFETs.

Low inversion channel mobility may limit the performance of the device due to a higher on-resistance and lower efficiency of the wide band gap semiconductor device, e.g. the SiC MOSFET. High threshold voltage instability may limit the reliability of the SiC MOSFET. There may be a demand to provide concepts for wide band gap semiconductor devices with improved on-resistance, efficiency and/or reliability.

SUMMARY

Some embodiments relate to a method for forming a wide band gap semiconductor device. The method may comprise forming a gate insulation layer on a wide band gap semiconductor substrate and annealing the gate insulation layer using at least a first reactive gas species and at least a second reactive gas species. The first reactive gas species may differ from the second reactive gas species.

Some embodiments relate to a method for forming a wide band gap semiconductor device. The method may comprise forming a gate insulation layer on a wide band gap semiconductor substrate, annealing the gate insulation layer in a reactive gas atmosphere comprising at least a reactive gas species, and annealing the gate insulation layer in an inert gas atmosphere after annealing the gate insulation layer in the reactive gas atmosphere.

Some embodiments relate to a wide band gap semiconductor device. The wide band gap semiconductor device may comprise a wide band gap semiconductor substrate, a gate insulation layer of a transistor, and a gate electrode of the transistor. The gate insulation layer may be located between the wide band gap semiconductor substrate and the gate electrode, and a charge carrier mobility of a channel region of the transistor within the wide band gap semiconductor substrate may be higher than 50 cm$^2$/Vs. A threshold voltage of the transistor may vary from a nominal threshold voltage by less than 10% of the nominal threshold voltage when a nominal gate voltage is applied at 150° C. for 1000 h.

Those skilled in the art will recognize additional features and advantages upon reading the following detailed description, and upon viewing the accompanying drawings.

BRIEF DESCRIPTION OF THE FIGURES

Some examples of methods and/or devices will be described in the following by way of example only, and with reference to the accompanying figures, in which.

DETAILED DESCRIPTION

Figure 1:
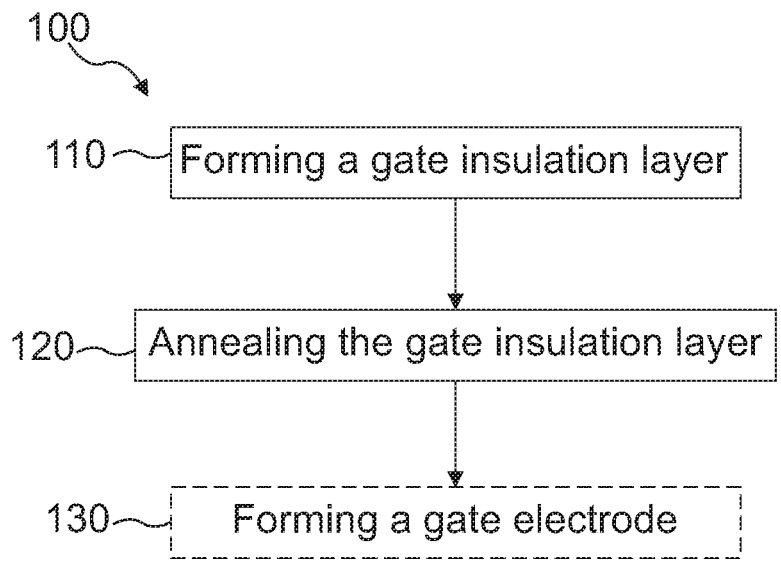
FIG. 1 shows a flow chart of an embodiment of a method for forming a wide band gap semiconductor device using a first and a second reactive gas species.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly (e.g. by the term "either . . . or . . . ") or implicitly defined otherwise. An alternative wording for the same combinations is "at least one of A and B" or "A and/or B". The same applies for combinations of more than two elements. Further, if a value is compared to a different value by using terms such as "higher than", "lower than", "longer than", "shorter than", "more than", "less than" or similar terms, the comparison always includes the boundaries of the comparison, in the sense of "at least" or "at most".

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Some wide band gap semiconductor devices like SiC MOSFETs may have a low inversion channel mobility and a high threshold voltage instability, e.g. compared to small band gap semiconductor devices like Si MOSFETs. Lower inversion channel mobility may lead to a higher on-resistance of the SiC MOSFET. Higher threshold voltage instability may lead to lower reliability of the SiC MOSFET.

Lower inversion channel mobility and higher bias temperature instability of SiC MOSFETs in comparison to Si MOSFETs may occur due to a larger bandgap of the wide band gap semiconductor device possibly leading to more traps in the semiconductor material or due to higher interface state and border trap densities at an interface at a SiC substrate and an oxide layer possibly caused by the involvement of carbon species and insufficient defect passivation using some annealing processes.

Other methods may either exhibit high inversion channel mobility and high bias temperature instability or low inversion channel mobility and low bias temperature instability or low inversion channel mobility and high bias temperature instability.

In the case of the wide band gap semiconductor device being a MOSFET, in particular a SiC MOSFET, depending on a voltage class of the wide band gap semiconductor device, a channel resistance of a SiC MOSFET may make up more than 50% of the total RONxA. Here, RONxA is the product of the on-resistance and the active device area (typically given in the unit [mΩmm2]). The active device area is the fraction of the total device area that conducts current (i.e., gate-pad, gate runners, JTE, etc. excluded). Inversion channel mobility achieved today may be about an order of magnitude lower than a theoretical bulk mobility of silicon carbide. A high threshold voltage drift during application may either lead to a gradual increase in on-resistance or RONxA (e.g., involving higher static losses) if the VTH (VTH: threshold voltage) drift is towards a positive direction or may lead to re-turn on (and device destruction) if the VTH drift is towards a negative direction.

Several different post oxidation techniques, for e.g. a SiC/SiO2 (SiO2: silicon dioxide) interface, may be used. As opposed to Si MOSFETs, the involvement of carbon related defect species may require alternative passivation schemes. In SiC/SiO2 systems defect passivation may be achieved by direct oxide growth in nitric oxide (NO) or in nitrous oxide (N2O). In addition or as an alternative, system defect passivation by nitric oxide or ammonia (NH3) post oxidation anneals (POAs) at temperatures of at least 550° C., or at least 600° C., or at least 750° C., or at least 900° C., or at least 1100° C. may be utilized. Hereinafter, the term "post oxidation anneal (POA)" refers to post anneal of both an oxidized portion of the semiconductor as well as a deposited oxide layer. In particular, "post oxidation anneal (POA)" may correspond to post anneal (i.e., annealing after) deposition of an oxide layer. Standard forming gas anneals or anneals in H2 may be not very effective in SiC while they provide very efficient interface state passivation in Si/SiO2 systems. All these post oxidation techniques may show limited ability to passivate all kinds of point defects at the SiC/SiO2 interface. Despite significant mobility and RONxA improvements which could already be achieved using for instance NO POAs, there is still a large gap to the theoretical performance limit and much room for improvement in RONxA.

Providing wide band gap semiconductor devices with a higher or increased inversion channel mobility and lower on-resistance and with a lower bias temperature instability and higher reliability may be provided by technical measures as described in connection with examples above or below.

FIG. 1 shows a schematic illustration of a method 100 for forming a wide band gap semiconductor device according to an embodiment. The method 100 may comprise forming a gate insulation layer 110 on a wide band gap semiconductor substrate and annealing the gate insulation layer 120 using at least a first reactive gas species and a second reactive gas species. The first reactive gas species used for annealing the gate insulation layer 120 may differ from the second reactive gas species used for annealing the gate insulation layer 120.

The method 100 may according to an example further comprise forming a gate electrode 130 on the gate insulation layer after annealing the gate insulation layer 120.

Annealing the gate insulation layer 120 using at least the first reactive gas species and the second reactive gas species according to the proposed method 100 may reduce point defects at an interface between the gate insulation layer and the wide band gap semiconductor substrate. By using the at least two different reactive gas species for annealing the gate insulation layer 120, a larger number of point defects may be reduced compared to using only one single reactive gas species for annealing the gate insulation layer because different kinds of point defects may be reduced by the different reactive gas species respectively. The reduced number of point defects at the interface may as a consequence lead to a higher inversion channel mobility of the wide band gap semiconductor device and to a reduced on-resistance. By annealing the gate insulation layer 120 using at least the first reactive gas species and the second reactive gas species, it may be possible to increase an efficiency of the wide band gap semiconductor device due to reduced power losses of the wide band gap semiconductor device.

Concurrently to increasing the inversion channel mobility of the wide band gap semiconductor device, due to annealing the gate insulation layer 120 using two or more different reactive gas species, it may be possible to reduce a threshold voltage drift and a bias temperature instability BTI of the wide band gap semiconductor device in comparison to a threshold voltage drift or BTI of the wide band gap semiconductor device when using only one reactive gas species for annealing the gate insulation layer. By annealing the gate insulation layer 120 using two or more reactive gas species the threshold voltage drift may be reduced and a reliability of the wide band gap semiconductor device may be increased due to lower bias temperature instability.

Annealing the gate insulation layer 120 may comprise one or more annealing processes. The gate insulation layer 120 may be heated in a defined gas atmosphere during an annealing process. Hereinafter, an annealing process may be a post oxidation anneal.

For the annealing process, the gate insulation layer located on the wide band gap semiconductor substrate may be placed in an annealing chamber of an annealing tool (e.g., an annealing system). During the annealing process, the annealing chamber may comprise a gas atmosphere with a reactive gas used for annealing.

Figure 4:
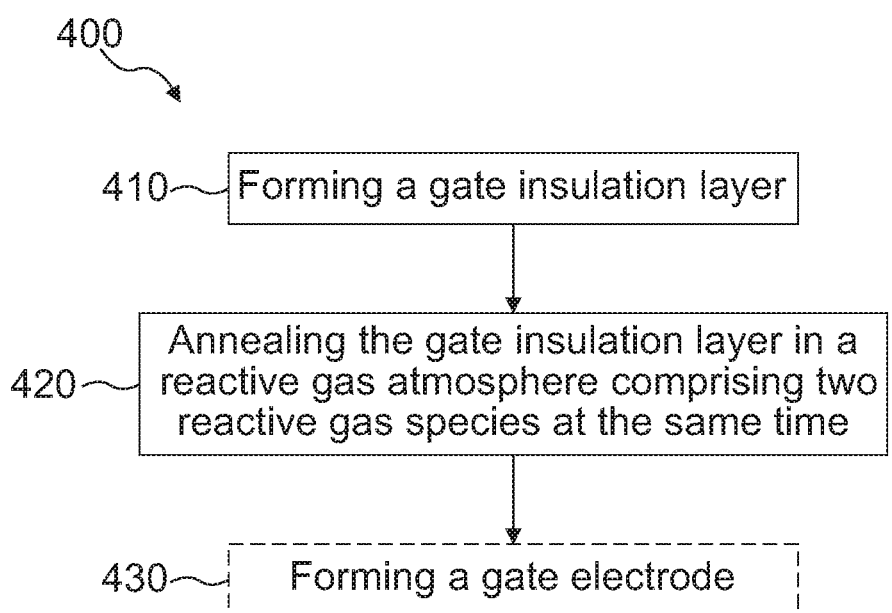
FIG. 4 shows a flow chart of an embodiment of a method for forming a wide band gap semiconductor device using a reactive gas atmosphere comprising a first and a second reactive gas species at the same time.

For example, the gate insulation layer 120 may be annealed by using the at least two different reactive gas species at the same time (as e.g. shown in conjunction with FIG. 4). For this, a gas atmosphere containing the at least two reactive gas species may be in the annealing chamber while heating the gate insulation layer located on the wide band gap semiconductor substrate.

Alternatively, the gate insulation layer may be annealed 120 by using the at least two different reactive gas species in two subsequent annealing processes using different gas atmospheres. In other words, a first annealing step and a second annealing step may be utilized. For example, the gate insulation layer may be annealed 120 in a first gas atmosphere containing the first reactive gas species during a first time interval (corresponding to the first annealing step) and in a second gas atmosphere containing the second reactive gas species during a second time interval (corresponding to the second annealing step). The first time interval and the second time interval may either be different or have the same length. The first time interval and the second time interval are consecutive time intervals. It is possible that the annealing temperature in the first annealing step (i.e., the temperature of the first gas atmosphere) is different to, typically higher than, the annealing temperature in the second annealing step. In a different example, the annealing temperature in the first annealing step is equal to the annealing temperature in the second annealing step.

Figure 3:
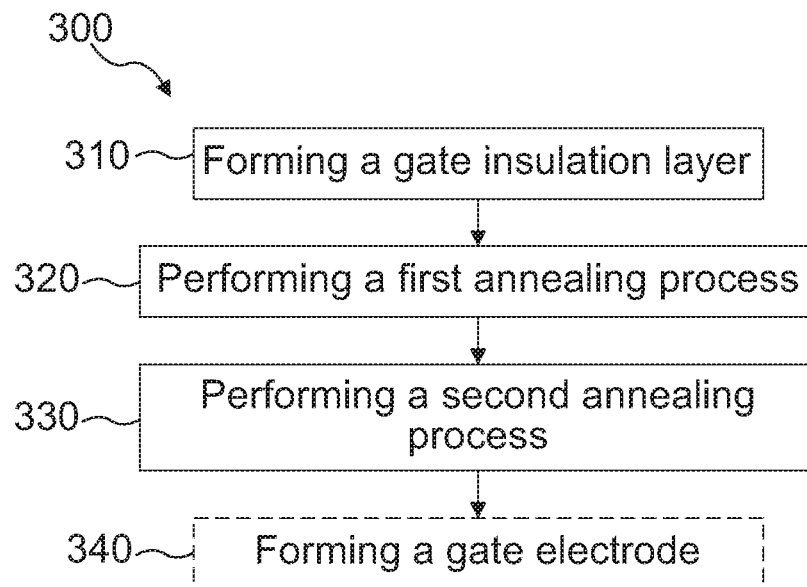
FIG. 3 shows a flow chart of an embodiment of a method for forming a wide band gap semiconductor device using a first and a second reactive gas species in a first and a second annealing process.

For example, the annealing of the gate insulation layer may comprise at least a first annealing process and a second annealing process (as e.g. shown in conjunction with FIG. 3). The second annealing process may be performed after the first annealing process. The first annealing process may be performed in a reactive gas atmosphere comprising more than 0.1% by volume (or more than 1%, more than 5%, more than 10% or more than 20%) of the first reactive gas species and/or less than 0.1% by volume (or less than 0.5%, less than 1% or less than 0.01%) of the second reactive gas species. The second annealing process may be performed in a reactive gas atmosphere comprising more than 0.1% by volume (or more than 1%, more than 5%, more than 10% or more than 20%) of the second reactive gas species and/or less than 0.1% by volume (or less than 0.5%, less than 1% or less than 0.01%) of the first reactive gas species. In some embodiments, the first annealing process may be performed in a reactive gas atmosphere comprising more than 5% or more than 10% (in each case by volume) of the first reactive gas species and/or less than 20% or less than 10% (in each case by volume) of the second reactive gas species, and vice versa for the second annealing process.

For example, between the at least two annealing processes, the reactive gas atmosphere comprising the first reactive gas species may be replaced by another reactive gas atmosphere comprising the second reactive gas species or by modifying the reactive gas atmosphere, e.g. by adding an additional reactive gas species to the reactive gas atmosphere. For example, subsequent annealing processes may be provided separately for every reactive gas species used for annealing the gate insulation layer 120.

Annealing the gate insulation layer 120 using separate annealing processes for the different reactive gas species may result in a higher freedom of parameter settings, like annealing time or annealing temperature, of the annealing processes. The parameters may be for example optimized according to the reactive gas species used in a corresponding annealing process. For example, in order to achieve high inversion channel mobility for the wide band gap semiconductor device, process parameters for annealing the gate insulation layer using the first reactive gas species may differ from process parameters for annealing the gate insulation layer using the second reactive gas species. However, in some examples it may be possible to use two or more reactive gas species for annealing the gate insulation layer in a common annealing process or in a reactive gas atmosphere at the same time. In this way, it may be possible to reduce the overall process time.

For example, if a first reactive gas species and a second reactive gas species are used for annealing the gate insulation layer 120, it may be possible to provide only one of the first and second reactive gas species for a predefined duration in a first annealing process while both of the first and second reactive gas species may be provided at the same time in a subsequent second annealing process. In this way, different annealing durations can be obtained for the first reactive gas species and the second reactive gas species.

For annealing the gate insulation layer, from processing point of view, POA time, temperature, gas composition and dilution in inert gas may be tuned in order to achieve an improved result with respect to RONxA and BTI. The combination of various reactive gases in one POA process or in a sequence of POA processes may provide an additional lever to improve device performance and reliability.

For example, nitric oxide (NO), nitrous oxide (N2O), hydrogen (H2), ammonia (NH3), hydrogen peroxide (H2O2), nitric acid (HNO3), water vapor (H2O), oxygen (O2, O3) and/or phosphoryl chloride (POCl3) may be used as reactive gas species for annealing the gate insulation layer. The stoichiometric equations given in brackets before are not to be understood as limiting the respective gas species to said stoichiometric composition. All of the before-described reactive gas species may be used as a first reactive gas species and/or as second reactive gas species. For example, the first reactive gas species may be one of NO, N2O, H2, or NH3, and the second reactive gas species may be another one of NO, N2O, H2, or NH3.

For example, the first reactive gas species may be NO and the second reactive gas species may be NH3. If the two reactive gas species are provided in separated annealing processes, the reactive gas atmosphere of the first annealing process may comprise NO and the reactive gas atmosphere of the second annealing process may comprise NH3. At least in the case of subsequently annealing with NO and NH3, an increased amount of hydrogen (H) and/or nitrogen (N) may be observed in the gate insulation layer, e.g. in the material of the gate insulation layer and/or at the interface to the substrate, compared to a gate insulation layer that has only been annealed with NO.

For example, the reactive gas species may be diluted with an inert gas when used for annealing the gate insulation layer 120. For example, the first reactive gas species may be diluted with an inert gas during the annealing of the gate insulation layer and a volume percent of the first reactive gas species may be higher than 1% (or higher than 5%, higher than 10% or higher than 20%) and/or less than 50% (or less than 30%, less than 20% or less than 10%), if the first reactive gas species is nitric oxide (NO). For example, the first reactive gas species may be diluted with N2 and/or argon. For example, the first reactive gas species NO may be used in a first annealing process followed by a second annealing process with a second reactive gas species.

Optionally, the second reactive gas species may be diluted with an inert gas during the annealing of the gate insulation layer. A volume percent of the second reactive gas species may be higher than 0.1% (or higher than 0.5%, higher than 1% or higher than 2%) and/or less than 10% (or less than 5%, less than 2% or less than 1%), if the second reactive gas species is ammonia (NH3). For example, the second reactive gas species NH3 may be used in a second annealing process following a first annealing process with a first reactive gas species. For example, the NH3 may be diluted with a same inert gas as used in a gas atmosphere comprising the first reactive gas species. For example, the second reactive gas species may be diluted with N2 or argon. Alternatively, NO and NH3 may be diluted commonly with the inert gas in a reactive gas atmosphere used for annealing the gate insulation layer 120 at the same time.

Optionally, the method 100 may further comprise heating the gate insulation layer in an inert gas atmosphere at a temperature lower than 1200° C., or lower than 1050° C., or lower than 950° C., after the annealing of the gate insulation layer 120. The heating may take place before forming the gate electrode 130 in order to reduce a hydrogen concentration within the gate insulation layer. For example, a heating temperature may be lower than 1200° C., or lower than 1100° C., or lower than 1000° C., or lower than 900° C., lower than 800° C., or lower than 700° C. For example, the inert gas atmosphere may comprise more than 50% of N2 and/or argon. The inert gas atmosphere may comprise less than 1% (or less than 0.5% or less than 0.1%) of oxygen.

Optionally, a duration of the annealing of the gate insulation layer 120 may be longer than 10 minutes and/or shorter than 600 minutes. The duration of the annealing may be a time span during which the gate insulation layer is heated in the reactive gas atmosphere containing the first reactive gas species and/or the second reactive gas species (or, in the case of an inert gas, the inert gas species). For example, the duration of the annealing of the gate insulation layer may be longer than 20 minutes, longer than 50 minutes, longer than 100 minutes, or longer than 200 minutes. For example, the duration of the annealing may be shorter than 520 minutes, shorter than 450 minutes, shorter than 350 minutes, or shorter than 250 minutes.

For example, if two or more annealing processes or separate annealing processes are used, the duration of the first and/or the subsequent (e.g. a second and/or a further) annealing process may be longer than 20 minutes, longer than 50 minutes, longer than 100 minutes, or longer than 200 minutes. For example, the duration of the first and/or the subsequent annealing process may be shorter than 520 minutes, shorter than 450 minutes, shorter than 350 minutes, or shorter than 250 minutes. For example, the duration of one annealing process may differ from the duration of another annealing process.

Optionally, an annealing temperature of the annealing of the gate insulation layer may be higher than 600° C. and/or lower than 1200° C. Throughout this application, the annealing temperature may be an average temperature of the gate insulation layer and/or of the reactive gas atmosphere during the annealing of the gate insulation layer. For example, the annealing temperature may be the temperature of an annealing process or of a plurality of annealing processes. For example, the annealing temperature of different annealing processes may differ depending on the annealing process or a reactive gas species used in the annealing processes. For example, the annealing temperature may be higher than 650° C., higher than 700° C., higher than 800° C., or higher than 900° C. For example, the annealing temperature may be lower than 1100° C., lower than 1050° C., lower than 900° C., or lower than 950° C.

Optionally, the proposed method may comprise heating the gate insulation layer in an inert gas atmosphere at a temperature higher than 950° C. before the annealing of the gate insulation layer to densify the gate insulation layer. In other words, heating the gate insulation layer may be performed after forming the gate insulation layer 110 and before annealing the gate insulation layer 120. For example, the gate insulation layer of the wide band gap semiconductor device may be heated before annealing the gate insulation layer. This may increase a density of the gate insulation layer and/or the electric field strength (e.g., a breakthrough electric field) of the gate insulation layer. For example, the inert gas atmosphere may comprise N2 and/or argon. For example, in order to pass over from the heating to annealing the gate insulation layer 120, at least one reactive gas species may be added to the inert gas atmosphere to provide a reactive gas atmosphere with a concentration of at least one reactive gas species (e.g. higher than 1%).

For example, a third reactive gas species may be used for annealing the gate insulation layer 120. In the first annealing process the reactive gas atmosphere may comprise less than 0.1%, less than 0.05%, or less than 0.01% of the third reactive gas species. For example, a third annealing process may be performed in a reactive gas atmosphere comprising more than 0.1%, more than 1%, more than 5%, or more than 20% of the third reactive gas species while comprising less than 0.1%, less than 0.05%, or less than 0.01% of the first and second reactive gas species. For example, it may be possible to provide three or more different reactive gas species at the same time, e.g. the reactive gas atmosphere may additionally comprise a third or more reactive gas species, respectively differing from each other. The reactive gas atmosphere may e.g. comprise more than 0.1%, more than 1%, more than 5% or more than 10% of the first and/or the second reactive gas species. For example, some kinds of different reactive gas species may require same or similar process parameters in order to achieve high inversion channel mobility and/or low BTI of the wide band gap semiconductor device. It may be efficient to provide the different reactive gas species in a reactive gas atmosphere at the same time to reduce the time needed for annealing the gate insulation layer. For example, two of the different reactive gas species may be provided at the same time in a first annealing process while a third reactive gas species may be provided separately in a second annealing process. For example, a plurality of different reactive gas species may be used in subsequent different reactive gas atmospheres and at least one of the reactive gas species of a first reactive gas atmosphere might not be provided in at least one of the other reactive gas atmospheres.

For example, the gate insulation layer may be an oxide layer or a nitride layer. For example, the gate insulation layer may be a silicon dioxide (SiO2) layer. For example, the gate insulation layer may be formed 110 by thermal oxidation of a surface of the wide band gap semiconductor substrate or by chemical vapor deposition (CVP).

For example, the gate electrode may be formed 130 by depositing an electrically conductive layer (e.g. a polysilicon layer, a copper layer or an aluminum layer). After deposition of the electrically conductive layer, the electrically conductive layer may be structured to obtain one or more gate electrodes of one or more transistors or transistor cells. In addition or as an alternative, the gate electrode may be a gate trench electrode of a gate trench that extends from a surface of the wide band gap semiconductor substrate into said substrate. In this case, a trench may be formed in the wide band gap semiconductor substrate, e.g. via etching. For forming the gate trench, the gate insulation layer may be deposited on side walls of the trench, after which an electrically conductive layer is filled into the trench for forming 130 the gate electrode. Furthermore, the gate insulation layer may be deposited at a bottom of the trench. For example, the gate insulation layer may cover the entire trench surface.

In general, the gate insulation layer may be positioned between the gate electrode and the wide band gap semiconductor substrate. In other words, the gate insulation layer may separate, for example electrically separate, the gate electrode from the semiconductor substrate.

The formed gate electrode may be a gate electrode of a transistor of the wide band gap semiconductor device insulated from the wide band gap semiconductor substrate by the gate insulation layer. For example, a gate voltage may be applicable to the gate electrode of the transistor of the wide band gap semiconductor device.

After forming the gate electrode, further manufacturing processes may be performed. For example, one or more wiring layers and/or metallization layers may be formed and wide band gap semiconductor devices formed on the same wide band gap semiconductor wafer may be separated (e.g. by dicing) from each other.

For example, the proposed method 100 may be used for forming a wide band gap semiconductor device comprising at least a transistor or a transistor arrangement. The transistor may be a field effect transistor (e.g. a MOSFET or an insulated gate bipolar transistor IGBT). A gate of the transistor may be formed by the gate insulation layer and the gate electrode. The gate may be a gate trench. For example, the wide band gap semiconductor substrate may comprise one or more source regions, one or more body regions and a drift region of the transistor arrangement. The source region and the drift region may each be of a first conductivity type. The body region may be of a second conductivity type opposite the first conductivity type. It is further possible for the wide band gap semiconductor substrate to comprise a diode region, which may have the same conductivity type as the body region, and/or a current spread region, which may be of the same conductivity type as the drift region and/or the source region. The gate insulation layer may directly adjoin the wide band gap semiconductor substrate. It is particularly possible for the gate insulation layer to directly adjoin regions of the semiconductor substrate that have a different conductivity type, for example, if applicable, the source region, the drift region, the body region, the current spread and/or the diode region.

The transistor arrangement may be a vertical transistor structure conducting current between a front side surface of the semiconductor substrate and a back side surface of the semiconductor substrate. For example, the transistor arrangement of the semiconductor device may comprise a plurality of source doping regions connected to a source wiring structure, a plurality of gate electrodes or a gate electrode grid connected to a gate wiring structure and a back side drain metallization.

The wide band gap semiconductor substrate may be either one of: a wide band gap semiconductor base substrate, a wide band gap semiconductor base substrate with a wide band gap semiconductor epitaxial layer grown on the wide band gap semiconductor base substrate or a wide band gap semiconductor epitaxial layer.

For example, the wide band gap semiconductor substrate may have a band gap larger than the band gap of silicon (1.1 eV). For example, the wide band gap semiconductor substrate may be a silicon carbide semiconductor substrate, or gallium arsenide (GaAs) semiconductor substrate, or a gallium nitride (GaN) semiconductor substrate. For example, the wide band gap semiconductor substrate is a silicon carbide substrate. The wide band gap semiconductor substrate may be a semiconductor wafer or a semiconductor die.

The wide band gap semiconductor device to be formed may be a power semiconductor device. A power semiconductor device or an electrical structure (e.g. transistor arrangement of the semiconductor device) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Figure 2:
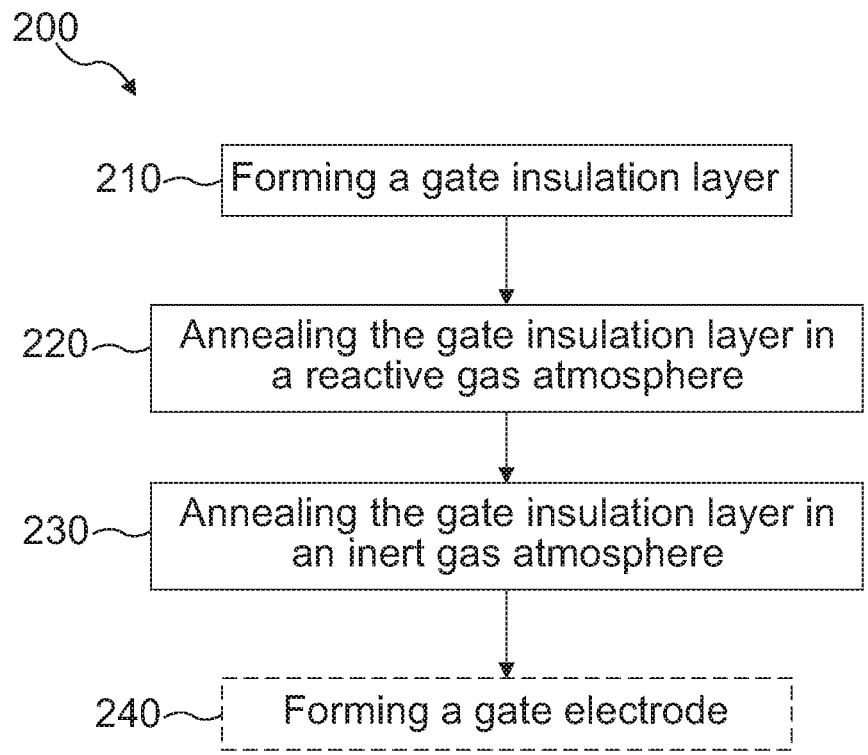
FIG. 2 shows a flow chart of an embodiment of a method for forming a wide band gap semiconductor device using a reactive gas atmosphere and an inert gas atmosphere.

FIG. 2 shows a schematic illustration of a method 200 for forming a wide band gap semiconductor device according to an embodiment. The method 200 comprises forming a gate insulation layer 210 on a wide band gap semiconductor substrate, annealing the gate insulation layer in a reactive gas atmosphere 220 comprising at least a reactive gas species. The method 200 further comprises annealing the gate insulation layer in an inert gas atmosphere 230 after annealing the gate insulation layer in the reactive gas atmosphere 220.

The method 200 may for example further comprise forming a gate electrode 240 on the gate insulation layer after annealing the gate insulation layer in the inert gas atmosphere 230.

For example, annealing the gate insulation layer in a reactive gas atmosphere 220 may comprise using a single reactive gas species in the reactive gas atmosphere or using a plurality of reactive gas species in the reactive gas atmosphere at the same time or in respective reactive gas atmospheres of a plurality of subsequent annealing processes.

For example, annealing the gate insulation layer in an inert gas atmosphere 230 after annealing the gate insulation layer in the reactive gas atmosphere 220 may reduce a hydrogen concentration within the gate insulation layer and result in an increased inversion channel mobility and/or reduced BTI. Using the method 200 for forming a wide band gap semiconductor device, e.g. a SiC MOSFET, may enable forming, providing, or manufacturing an improved wide band gap semiconductor device.

For example, the reactive gas species may comprise at least one of nitric oxide (NO) and ammonia (NH3) and a volume percent of the reactive gas species may be higher than 0.1%. For example, the volume percent of the reactive gas species may be higher than 0.1%, higher than 1%, higher than 5%, or higher than 10%. For example, the reactive gas atmosphere may comprise NO with a volume percent higher than 1% and lower than 50%. Alternatively or additionally, the reactive gas atmosphere may comprise NH3 with a volume percent higher than 0.1% and lower than 10%. For example, the reactive gas species may be diluted with nitrogen (N2) or argon. In both cases, at least 90% of the remaining percentage of the gas atmosphere or even the entire remaining percentage of the gas atmosphere may be composed of an inert gas. For example, the reactive gas atmosphere may comprise at least 0.1% or at least 5% or at least 10% of the reactive gas species (by volume) and at least 99% or at least 94% or at least 89%, respectively, of an inert gas species (by volume).

In some embodiments, the reactive gas atmosphere may comprise nitric oxide (NO) with a volume percent higher than 5% or higher than 8%, for example 10% further, the reactive gas atmosphere may comprise nitrogen (N2) with a volume percentage higher than 94% or higher than 91%, for example 90%. The inert gas atmosphere may comprise nitrogen gas (N2) with a volume percent of at least 90% or at least 95%.

For example, the inert gas atmosphere may have a concentration of oxygen (O) with a volume percent lower than 0.5%. For example, the volume percent of O of the inert gas atmosphere may be lower than 0.1%, lower than 1%, lower than 3%, or lower than 5%. For example, the inert gas atmosphere may comprise a volume percent of more than 90% (or more than 95%, more than 99% or more than 99.5%) of one or more inert gases (e.g. N2 and/or argon).

In some embodiments, the annealing in the reactive gas atmosphere may be performed for at least 240 min. or at least 260 min. and at most 350 min. or at most 310 min. or at most 280 min., for example for 270 min. Separately or in combination, the annealing in the inert gas atmosphere may be performed for at least 20 min. or at least 25 min., and for at most 50 min. or at most 40 min., for example for 30 min. The annealing in the inert gas atmosphere may be shorter than the annealing in the reactive gas atmosphere. For example, the duration of the annealing in the inert gas atmosphere may be at most 30% or at most 20% or at most 15% of the duration of the annealing in the reactive gas atmosphere. The annealing in the inert gas atmosphere and/or the annealing in the reactive gas atmosphere may be performed at a temperature of at least 900° C. and at most 1200° C., for example at least 1050° C. and at most 1180° C. (e.g., 1100° C. or 1130° C.).

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3-5).

FIG. 3 shows a schematic illustration of a method 300 for forming a wide band gap semiconductor device using a first and a second reactive gas species in a first and a second annealing process according to one embodiment. Method 300 comprises forming a gate insulation layer 310, performing a first annealing process 320, and performing a second annealing process 330. For example, the method 300 may comprise forming a gate electrode 340.

Method 300 shown in FIG. 3 is an example with separated annealing processes. For example, for performing the first annealing process 320, a first reactive gas atmosphere comprising a first reactive gas species can be used. For performing the second annealing process 330, a second reactive gas atmosphere comprising a second reactive gas species different from the first reactive gas species may be used. For example, an annealing temperature of the first annealing process can be higher than an annealing temperature of the second annealing process. In another example, however, an annealing temperature of the first annealing process can be lower than an annealing temperature of the second annealing process.

In the exemplary embodiment according to method 300, a SiC MOSFET is formed by forming a gate insulation layer 310, e.g. using chemical vapor deposition (CVD), and performing annealing processes 320, 330. For example, a standard NO process is performed as the first annealing process and a NH3 process is performed as the second annealing process after CVD deposition of the bulk gate oxide of the SiC MOSFET. A sequence of the combined POA processes may be NO followed by NH3.

The NO POA may be performed at temperatures between 1000° C. and 1200° C. for at least 10 min. up to at most 600 min. using dilutions between 1% and 50% of NO in N2 (typically 10%). The NH3 POA may be performed at temperatures between 900° C. and 1200° C. for at least 10 min. and at most 600 min using dilutions between 0.1% and 10% NH3 in N2 (Typically 3.6%). Typically, the NH3 POA is performed at a temperature of at least 1050° C. and at most 1180° C. (e.g., 1100° C. or 1130° C.), for example for at least 50 min. and at most 70 min. (e.g. 60 min.) or for at least 15 min. and at most 25 min. (e.g. 20 min.).

Using both NO and NH3 for annealing the gate insulation layer can result in a larger inversion channel mobility than using only one of NO and NH3, for example. For example compared to using only NO, the inversion channel mobility can be up to 40% higher when using both NO and NH3. Regarding the BTI, when using a combined POA with both NO and NH3, the BTI of the wide band gap semiconductor device to be formed can be decreased compared to using only NH3 for annealing the gate insulation layer.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1-2 and 4-5).

FIG. 4 shows a schematic illustration of an embodiment of a method 400 for forming a wide band gap semiconductor device using a reactive gas atmosphere comprising a first and a second reactive gas species at the same time. Method 400 comprises forming a gate insulation layer 410, and annealing the gate insulation layer in a reactive gas atmosphere comprising two reactive gas species at the same time 420. The method 400 may for example further comprise forming a gate electrode 430.

According to method 400 annealing the gate insulation layer may be performed in a single annealing process. For example, the first and the second reactive gas species may be diluted in an inert gas to provide a reactive gas atmosphere, wherein the concentration of the first and second reactive gas species in the reactive gas atmosphere may be e.g. higher than 0.1% or higher than 1%. For example, a concentration of the first reactive gas species may differ from a concentration of the second reactive gas species within the reactive gas atmosphere. Optionally, annealing the gate insulation layer in a reactive gas atmosphere comprising two reactive gas species at the same time 420 may further comprise additional reactive gas species in the reactive gas atmosphere, e.g. a third and/or a fourth reactive gas species at the same time.

More details and aspects are mentioned in connection with the embodiments described above or below. The embodiments shown in FIG. 4 may comprise one or more optional additional features corresponding to one or more aspects mentioned in connection with the proposed concept or one or more embodiments described above or below (e.g. FIGS. 1-3 and 5).

Figure 5:
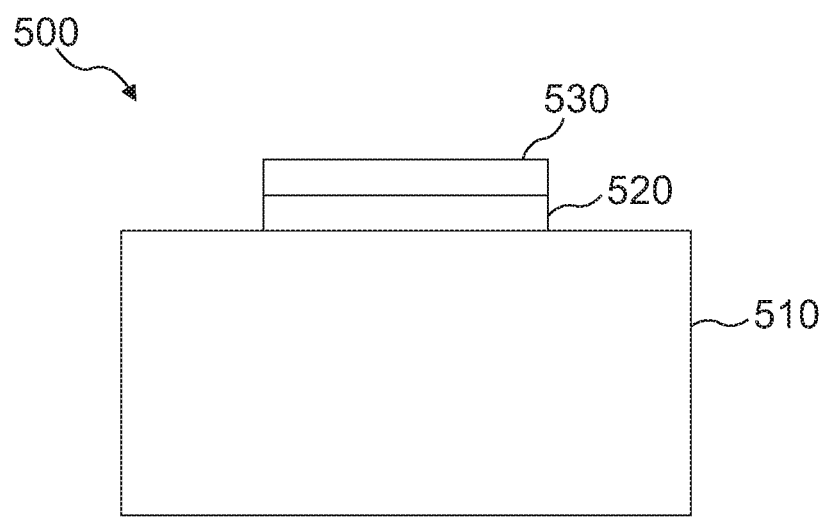
FIG. 5 shows a schematic illustration of an embodiment of a wide band gap semiconductor device.

FIG. 5 shows a schematic illustration of a wide band gap semiconductor device 500 according to one embodiment. The wide band gap semiconductor device 500 may comprise a wide band gap semiconductor substrate 510, a transistor, a gate insulation layer 520 of the transistor, and a gate electrode 530 of the transistor. The wide band gap semiconductor device 500 may be formed according to the exemplary embodiments shown in FIGS. 1 to 4, for example, comprising annealing the gate insulation layer 520 in a reactive gas atmosphere comprising at least one reactive gas species. The wide band gap semiconductor device 500 may provide high inversion channel mobility and low BTI.

The gate insulation layer of the wide band gap semiconductor device 500 may be located between the wide band gap semiconductor substrate and the gate electrode. The gate insulation layer and the gate electrode may be parts of a transistor of the wide band gap semiconductor device 500. For example, the wide band gap semiconductor device 500 is or comprises at least one transistor, e.g. a MOSFET. In one embodiment, the wide band gap semiconductor device 500 may be a vertical trench gate MOSFET, for instance as described in connection with the embodiments of the method in FIGS. 1 to 4.

According to an example, a charge carrier mobility of a channel region of a transistor within the wide band gap semiconductor substrate is higher than 50 cm$^2$/Vs. For example, the charge carrier mobility of the channel region of the transistor is higher than 70 cm$^2$/Vs or higher than 90 cm$^2$/Vs. The high charge carrier mobility can be a result of the annealing of the gate insulation layer 520 in a reactive gas atmosphere during manufacturing the wide band gap semiconductor device 500.

According to an example, a threshold voltage of the transistor may vary from a nominal threshold voltage by less than 10% of the nominal threshold voltage when a nominal gate voltage is applied at 150° C. for 1000 h. For example, the nominal threshold voltage varies by less than 8%, by less than 8% or by less than 8% of the nominal threshold voltage when a nominal gate voltage is applied at 150° C. (or 150° C. with a tolerance of +/−10° C. or +/−30° C.) for 1000 h and/or for more than 1000 h, e.g. for more than 1500 h or more than 2000 h. The low variation of the nominal gate voltage may be a result of a low BTI achieved due to the annealing of the gate insulation layer 520 in a reactive gas atmosphere during manufacturing the wide band gap semiconductor device 500 according to a proposed method 100 or 200.

According to an example, a refractive index of the gate insulation layer 520 of the wide band gap semiconductor device 500 is larger than 1.457 and lower than 1.468. The refractive index may be the refractive index measured at a wavelength of at least 631 nm or at most 633 nm, e.g. at 632 nm (in particular Helium-Neon wavelength at 632.816 nm). The specific refractive index of the gate insulation layer 520 may be a result of the annealing of the gate insulation layer 520 in a reactive gas atmosphere during manufacturing the wide band gap semiconductor device 500, using two different reactive gas species. For example, the refractive index may be larger than 1.459 or larger than 1.461, and/or lower than 1.466 or lower than 1.464. For example, the refraction index may be larger than 1.457 and/or lower than 1.460 or larger than 1.465 and/or lower than 1.468.

The gate insulation layer 520 may be an oxide layer. For example, the oxide layer may be a SiO2 layer and the gate electrode 530 may be a gate electrode of a transistor of the wide band gap semiconductor device 500, wherein the wide band gap semiconductor substrate 510 of the wide band gap semiconductor device 500 may be e.g. a SiC substrate.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-4) or below.

Some examples relate to performance and threshold voltage stability improvements of SiC MOSFETs using a combination of various reactive gases in a post oxidation anneal. According to some examples, a POA anneal after thermal gate oxide growth or gate oxide deposition is proposed which involves at least two combinations of NO, N2O, H2 or NH3 as reactive gases diluted in inert gases such as N2 or Argon. POA plateau temperatures may be in the range between 900° C. and 1200° C. (typically 1100-1150° C.) for plateau times in the range of 10 min to 600 min (typically 60-300 min). Dilution of reactive gases in inert gases may be in the range of 1-50% (typically 3-15%).

The annealing process with at least two different reactive gas species may be carried out after forming the gate insulation layer on the wide band gap semiconductor substrate, and may be used for annealing the gate insulation layer. An annealing process performed after forming the gate insulation layer may be called post oxidation annealing (POA). In other words, some examples relate to a combined POA process comprising at least two different reactive gas species. The combined POA process may increase the inversion channel mobility of the wide band gap semiconductor device (e.g. a SiC MOSFET) up to 40% with respect to another POA processes. As a result, using the combined POA process may decrease a RON (RON: on-resistance) of a SiC MOSFET up to 20% with respect to standard POA. At the same time, the BTI drift may be limited in comparison to a POA process using only one single reactive gas species.

The proposed POA may be either performed in two or more steps using only one reactive gas species diluted in inert gas at a time or in one single step using a mix of at least two reactive gases at once diluted in inert gas.

As further embodiment an extra oxide densification step is proposed which may be performed in inert gas at a temperature higher than 950° C. (typically 1050° C. or 1100° C.) prior to or after the actual POA described above. This inert densification may be either performed as a separate furnace run or may be included in the same furnace run prior to or after the actual POA with the reactive gases.

A lower RONxA of one device, e.g. a wide band gap semiconductor device 500, may impact the number of chips which need to be used in a system dedicated for a certain current capability. A lower RONxA reduces static losses and cooling effort. Forming and using wide band gap semiconductor device 500 may increase an efficiency of a system and reduce costs.

According to at least one embodiment, not only one but a combination of various reactive gases are used, which may improve the channel mobility and reduce BTI in SiC MOSFETs. One idea why the combination of different reactive gases may lead to an improvement of channel mobility and RONxA is that different reactive species may passivate SiC/SiO2 interface defects of different nature, e.g. different energy. For example, while the NO POA may not only passivate defects but also lead to some thermal oxidation of the SiC/SiO2 interface, NH3 is non-oxidizing and thus has the ability to passivate other defect types which do not react with NO.

Any reduction in RONxA may directly impact active area and directly impact processing costs. Any reduction in BTI may directly impact the VGSTH max (VGSTH max: maximum gate substrate threshold voltage) and RON max (maximum on-resistance) rating of the device and thereby directly impact yield and costs.

For example, the proposed method for forming a wide band gap semiconductor device may be used instead of a totally different interface passivation scheme which does not rely on POA but may rather work with various cleaning sequences or barium/strontium deposition and/or silicon nitride deposition prior to gate oxide thermal growth or deposition, as they may not lead to better results than using the proposed POA.

For example, the wide band gap semiconductor device formed according to the method 100 may be a SiC MOSFET. The wide band gap semiconductor substrate of the SiC MOSFET may be a silicon carbide (SiC) substrate and the formed gate insulation layer of the SiC MOSFET can be a silicon dioxide (SiO2) layer. Annealing the SiO2 layer using at least a first reactive gas species and a second reactive gas species may be a POA process carried out before forming a gate electrode 130 of the SiC MOSFET. Using the two different reactive gas species according to an embodiment may result in the possibility to enable forming an improved SiC MOSFET with respect to efficiency and reliability.

A proposed concept uses a combination of POAs using different reactive gas species. A proposed process sequence which e.g. combines NO and NH3 POAs may yield a good compromise between enhanced mobility and limited BTI. For some split wafers, the combined POA may enhance the inversion channel mobility of the SiC MOSFETs by up to 30-50% and reduce the RONxA by up to 10-30% with respect to an already optimized NO process. At the same time BTI may remain limited in comparison to NH3 only.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method for forming a wide band gap semiconductor device, the method comprising:
   forming a gate insulation layer on a wide band gap semiconductor substrate;
   in an annealing tool, annealing the gate insulation layer in a reactive gas atmosphere comprising at least a reactive gas species;
   before annealing the gate insulation layer in the reactive gas atmosphere, heating the gate insulation layer in an inert gas atmosphere at a temperature of at least 950° C.; and
   after annealing the gate insulation layer in the reactive gas atmosphere and without exposing the gate insulation layer to the atmosphere outside the annealing tool, annealing the gate insulation layer in an inert gas atmosphere.

2. The method of claim 1, wherein the reactive gas species comprises at least one of nitric oxide and ammonia, and wherein a volume percent of the reactive gas species is at least 0.1 vol %.

3. The method of claim 1, wherein the reactive gas species comprises at least 5 vol % nitric oxide, wherein the inert gas species comprises at least 90% nitrogen, and wherein a duration of the annealing in the inert gas species is shorter than a duration of the annealing in the reactive gas species.

4. The method of claim 1, wherein the inert gas atmosphere has a concentration of oxygen of at most 0.5 vol %.

5. The method of claim 1, wherein a duration of each annealing of the gate insulation layer is at least 10 minutes and at most 600 minutes.

6. The method of claim 1, wherein an annealing temperature of each annealing of the gate insulation layer is at least 600° C. and at most 1200° C.

7. The method of claim 1, further comprising:
   after annealing the gate insulation layer in the inert gas atmosphere, forming a gate electrode on the gate insulation layer.

8. The method of claim 7, wherein the gate electrode is a gate trench electrode that extends from a surface of the wide band gap semiconductor substrate into the wide band gap semiconductor substrate.

9. The method of claim 1, wherein the wide band gap semiconductor substrate is a silicon carbide substrate.

10. The method of claim 1, wherein the gate insulation layer is a silicon dioxide layer.

11. A wide band gap semiconductor device, comprising:
   a wide band gap semiconductor substrate;
   a transistor;
   a gate insulation layer of the transistor; and
   a gate electrode of the transistor,
   wherein the gate insulation layer is located between the wide band gap semiconductor substrate and the gate electrode,
   wherein a charge carrier mobility of a channel region of the transistor within the wide band gap semiconductor substrate is at least 50 $cm^2$/Vs,
   wherein a threshold voltage of the transistor varies from a nominal threshold voltage by at most 10% of the nominal threshold voltage when a nominal gate voltage is applied at 150° C. for 1000 h.

12. The wide band gap semiconductor device of claim 11, wherein a refractive index of the gate insulation layer is at least 1.457 and at most 1.468 at a wavelength of at least 631 nm and at most 633 nm.

13. The wide band gap semiconductor device of claim 11, wherein the wide band gap semiconductor substrate is a silicon carbide substrate.

\* \* \* \* \*